(12) United States Patent
Li et al.

(10) Patent No.: US 8,570,475 B2
(45) Date of Patent: Oct. 29, 2013

(54) ARRAY SUBSTRATE, LIQUID CRYSTAL PANEL AND LIQUID CRYSTAL DISPLAY

(75) Inventors: Kun Li, Beijing (CN); Minghua Xuan, Beijing (CN); Young Yik Ko, Beijing (CN)

(73) Assignees: BOE Technology Group Co., Ltd., Beijing (CN); Chengdu BOE Optoelectronics Technology Co., Ltd., Chengdu (CN)

( * ) Notice: Subject to any disclaimer, the term of this patent is extended or adjusted under 35 U.S.C. 154(b) by 45 days.

(21) Appl. No.: 13/220,857

(22) Filed: Aug. 30, 2011

(65) Prior Publication Data

US 2012/0050643 A1    Mar. 1, 2012

(30) Foreign Application Priority Data

Aug. 31, 2010 (CN) ...................... 2010 2 0513092 U

(51) Int. Cl.
*G02F 1/1343* (2006.01)
(52) U.S. Cl.
USPC .......................................... 349/139; 349/141

(58) Field of Classification Search
None
See application file for complete search history.

(56) References Cited

U.S. PATENT DOCUMENTS

| 8,159,641 | B2 * | 4/2012 | Ham et al. | 349/139 |
| 2007/0052899 | A1 * | 3/2007 | Lin et al. | 349/141 |
| 2009/0073365 | A1 * | 3/2009 | Jeon | 349/139 |

* cited by examiner

*Primary Examiner* — Richard Kim
(74) *Attorney, Agent, or Firm* — Ladas & Parry LLP

(57) ABSTRACT

An array substrate is provided. The array substrate comprises a base substrate. A plurality of gate lines, a plurality of data lines, and a common electrode are formed on the base substrate. A plurality of pixel units are defined by the intersecting of the gate lines and the data lines, a pixel electrode is provided in each of the pixel units, the common electrode extends over the pixel units and overlaps the pixel units, and also the common electrode overlaps with the gate lines and the data lines, and an overlapping region slit is provided in the common electrode for each pixel unit in an overlapping region between the common electrode and one of the gate lines and data lines surrounding the pixel unit. Also, a liquid crystal panel and a liquid crystal display comprising an array substrate are also provided.

12 Claims, 11 Drawing Sheets

ARRAY SUBSTRATE, LIQUID CRYSTAL PANEL AND LIQUID CRYSTAL DISPLAY

BACKGROUND

Embodiments of the disclosed technology relate to an array substrate, a liquid crystal panel and a liquid crystal display.

At present, liquid crystal displays are the most popular kind of flat panel displays, and thin film transistor liquid crystal display (TFT-LCDs) have been prevailing the market of liquid crystal displays. Among various kinds of TFT-LCDs, fringe field switching (FFS) type TFT-LCD which comprises, for example, a transparent pixel electrode of a plane shape in a lower layer and a common electrode of a grid-like shape in an upper layer is widely used due to the characteristics such as high brightness, high contrast and wide view angle.

Typically, an FFS type TFT-LCD comprises an array substrate, a color filter substrate and a liquid crystal layer sandwiched between the two substrates. FIG. 1A is a top view showing a portion of a conventional array substrate, and FIG. 1B is a sectional view taken along line A-A in FIG. 1. As shown in FIGS. 1A and 1B, the array substrate comprises a base substrate 1. A plurality of data lines 5 and a plurality of gate lines 2 are formed on the base substrate 1 and intersect with each other. A plurality of pixel units are formed in a matrix defined by the intersecting of the data lines 5 and the gate lines 2. Each pixel unit comprises a TFT switch, a pixel electrode 11 and a common electrode 12. The TFT switch comprises a gate electrode 3, a source electrode 7, a drain electrode 8 and an active layer 6. The gate electrode 3 is connected with one gate line 2, the source electrode 7 is connected with one data line 5, the drain electrode 8 is connected with the pixel electrode 11 in the pixel unit, and the active layer 6 is provided between the source/drain electrodes and the gate electrode 3. A gate insulating layer 4 is formed on the gate line 2 and the gate electrode 3 so that the gate line 2 and the gate electrode 3 are insulated from the data line 5. A first passivation layer 9 is formed on the TFT switch and the data line 5 to cover them so that the TFT switch and the data line 5 are insulated from the pixel electrode 11. The pixel electrode 11 is connected with the drain electrode 8 through a passivation layer via hole 10. A second passivation layer 13 is formed on the base substrate 1 to cover the above-mentioned structure, and the common electrode 12 is formed on the second passivation layer 13 so that it is insulated from the data line 5, the gate line 2 and the pixel electrode 11. In addition, the common electrode 12 is provided to be of a grid-like shape and the lower-level pixel electrode 11 is exposed from the common electrode 12, and several forms suitable for the common electrode 12 are shown in FIGS. 1C-1F. FIG. 1C shows that the grid-like common electrode has single-domain strips parallel to the data lines 5, FIG. 1D shows that the grid-like common electrode has dual-domain strips extending along the data lines 5, FIG. 1E shows that the grid-like common electrode has single-domain strips parallel the gate lines 2, and FIG. 1F shows that the grid-like common electrode has dual-domain strips extending along the gate lines 2. In FIG. 1C-1F, the common electrode 12 is the shadow region, and the pixel electrode 11 is exposed from the slit between adjacent strips of the common electrode 12. It should be noted that, the pixel electrode 11 merely is an example of the component exposed by the common electrode 12, and the exposed component is not limited to the pixel electrode 11 depending on the positions of the strips of the common electrode 12.

In the FFS type TFT-LCD, the light transmittance ratio is greatly increased because the electrodes are formed by transparent materials rather than opaque metal materials. In addition, in the FFS type TFT-LCD, both the pixel electrode and the common electrode of each pixel unit are formed on the same array substrate, a fringe electric field is generated between the pixel electrode and the common electrode, and thus the range of the view angle can be widened. However, in the FFS type TFT-LCD, even when the common electrode are of a grid-like shape, a large overlapping region is formed between the common electrode of a pixel unit and the underlying gate lines and/or data lines surrounding the pixel unit, and thus parasitic capacitance is generated, and a resistive-capacitive (RC) delay of the signal transmitted over the gate line and/or data line occurs. In addition, in the trend to liquid crystal panels of a larger size and a higher resolution, gate lines and data lines of increased lengths and amounts are used; and in this case, the overlapping region between the common electrode of a pixel unit and the gate lines and/or data lines surrounding the pixel unit is further increased, and thus parasitic capacitance is increased and the RC delay of signal is aggravated as well. When the signal delay is aggravated to a certain degree, the charging characteristics of a liquid crystal panel would be deteriorated, defects such as bright spots, dark spots and the like are generated on displayed images, and thus display quality is decreased.

SUMMARY

According to a first aspect of the disclosed technology, an array substrate is provided. The array substrate comprises a base substrate, and a plurality of gate lines, a plurality of data lines, and a common electrode formed on the base substrate. A plurality of pixel units are defined by the intersecting of the gate lines and the data lines, a pixel electrode is provided in each of the pixel units, the common electrode extends over the pixel units and overlaps the pixel units, and also the common electrode overlaps with the gate lines and the data lines, and an overlapping region slit is provided in the common electrode for each pixel unit in an overlapping region between the common electrode and one of the gate lines and data lines surrounding the pixel unit.

According to a second aspect of the disclosed technology, a liquid crystal panel is provided. The liquid crystal panel comprises an array substrate, a color filter substrate and a liquid crystal layer sandwiched therebetween. The array substrate comprises a base substrate, and a plurality of gate lines, a plurality of data lines, and a common electrode formed on the base substrate. A plurality of pixel units are defined by the intersecting of the gate lines and the data lines, a pixel electrode is provided in each of the pixel units, the common electrode extends over the pixel units and overlaps the pixel units, and also the common electrode overlaps with the gate lines and the data lines, and an overlapping region slit is provided in the common electrode for each pixel unit in an overlapping region between the common electrode and one of the gate lines and data lines surrounding the pixel unit.

According to a third aspect of the disclosed technology, a liquid crystal display is provided. The liquid crystal display comprises an external house, a liquid crystal panel, a driving circuit and a backlight module. The liquid crystal panel comprises an array substrate. The array substrate comprises a base substrate, and a plurality of gate lines, a plurality of data lines, and a common electrode formed on the base substrate. A plurality of pixel units are defined by the intersecting of the gate lines and the data lines, a pixel electrode is provided in each of the pixel units, the common electrode extends over the pixel units and overlaps the pixel units, and also the common electrode overlaps with the gate lines and the data lines, and an overlapping region slit is provided in the common electrode for each pixel unit in an overlapping region between the common electrode and one of the gate lines and data lines surrounding the pixel unit.

Further scope of applicability of the disclosed technology will become apparent from the detailed description given hereinafter. However, it should be understood that the detailed description and specific examples, while indicating preferred embodiments of the disclosed technology, are given by way of illustration only, since various changes and modifications within the spirit and scope of the disclosed technology will become apparent to those skilled in the art from the following detailed description.

BRIEF DESCRIPTION OF THE DRAWINGS

The disclosed technology will become more fully understood from the detailed description given hereinafter and the accompanying drawings which are given by way of illustration only, and thus are not limitative of the disclosed technology and wherein.

DETAILED DESCRIPTION

Hereinafter, embodiments of the disclosed technology are described in detail with reference to the accompanying drawings so that the objects, technical solutions and advantages of the embodiments of the disclosed technology will become more apparent. It should be noted that the embodiments described below merely are a portion of but not all of the embodiments of the disclosed technology, and thus various modifications, combinations and alterations may be made on basis of the described embodiments without departing from the spirit and scope of the disclosed technology.

First Embodiment

Figure 2A:
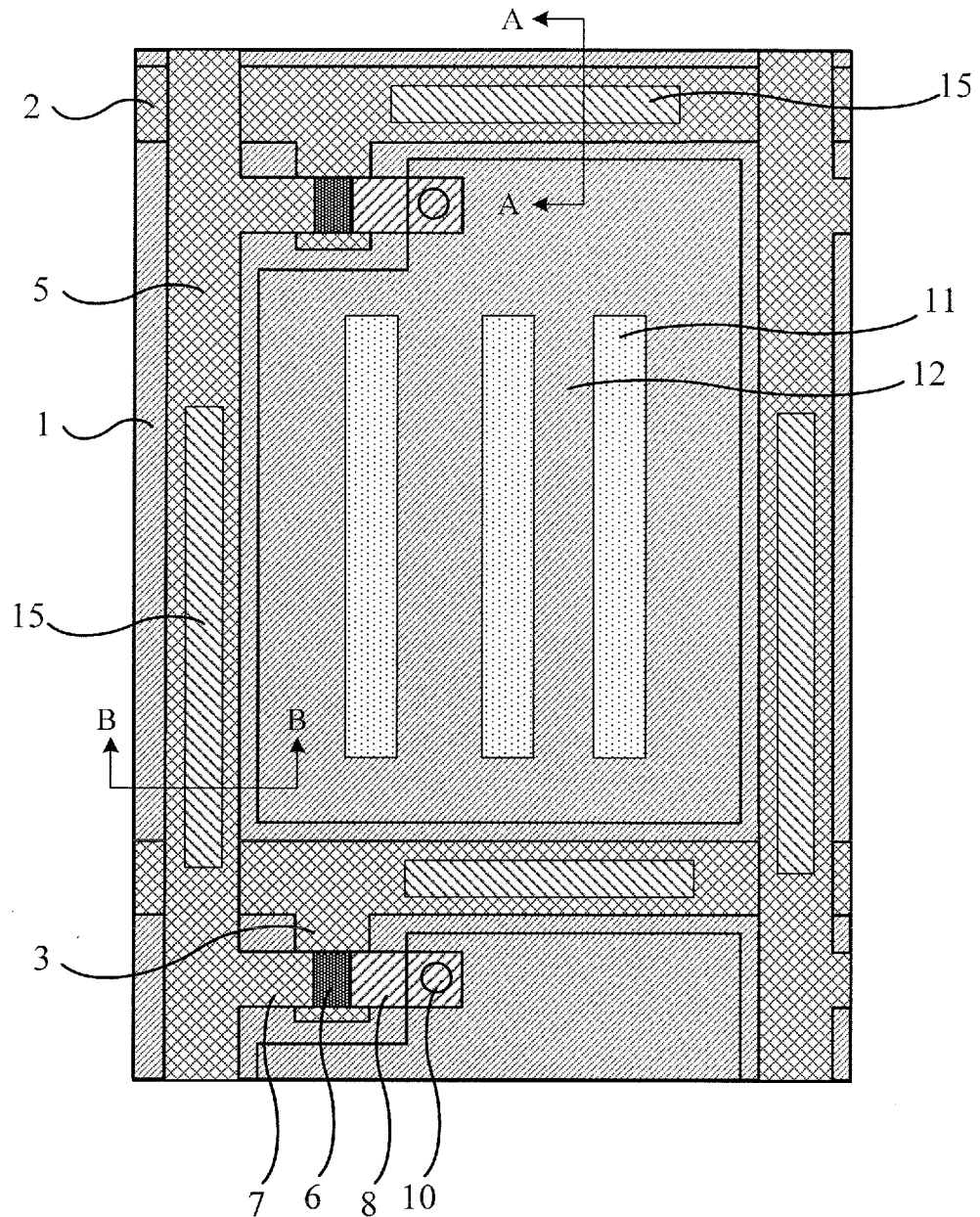
FIG. 2A is a top view showing a portion of an array substrate according to a first embodiment of the disclosed technology.
Figure 2B:
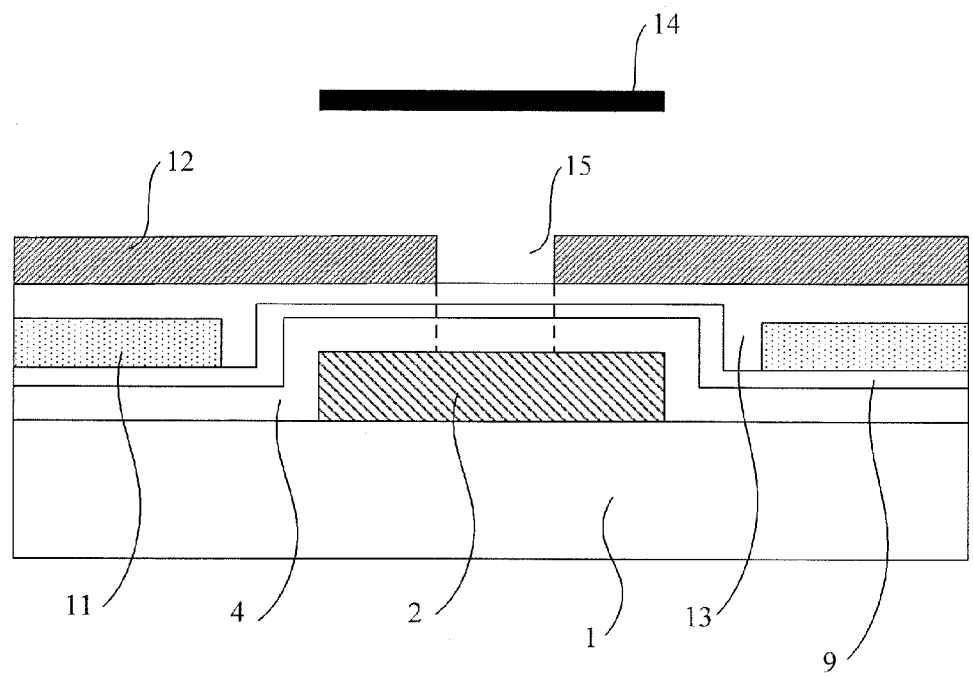
FIG. 2B is a sectional view taken along line A-A in FIG. 2A.
Figure 2C:
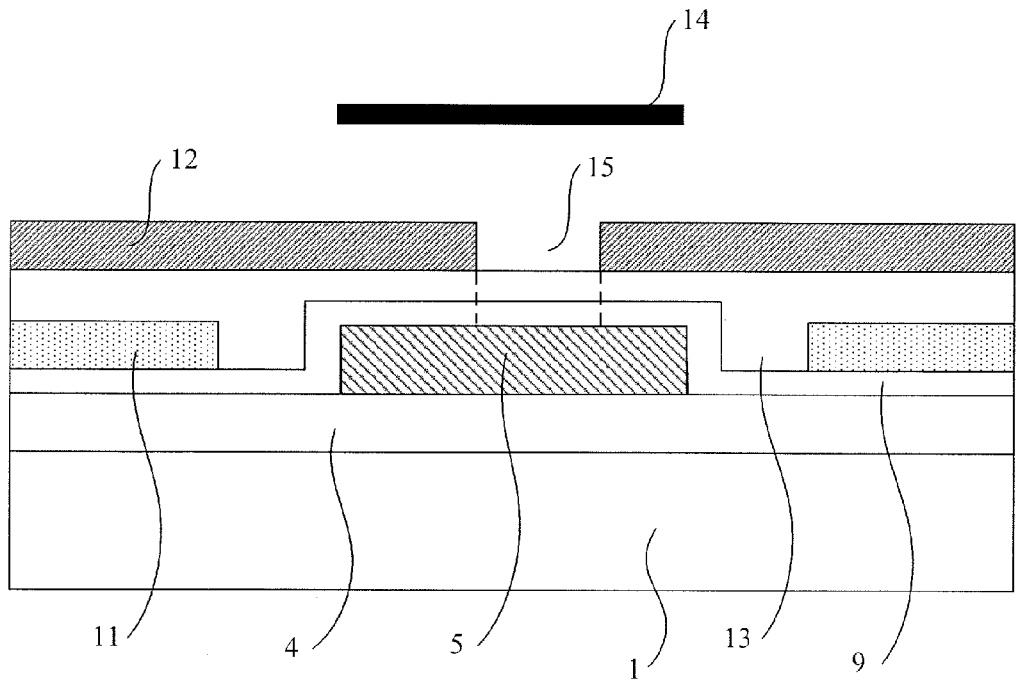
FIG. 2C is a sectional view taken along line B-B in FIG. 2A.

FIG. 2A is a top view showing a portion of an array substrate according to a first embodiment of the disclosed technology, FIG. 2B is a sectional view taken along line A-A in FIG. 2A, and FIG. 2C is a sectional view taken along line B-B in FIG. 2A. As shown in FIGS. 2A-2C, the array substrate according to the embodiment comprises a base substrate 1. A plurality of gate lines 2 and a plurality of data lines 5 are formed on the base substrate 1. With the intersecting of the gate lines 2 and the data lines 5, a plurality of pixel units are formed in a matrix. Each pixel unit comprises a TFT switch and a pixel electrode 11. The TFT switch comprises a gate electrode 3, a source electrode 7, a drain electrode 8 and an active layer 6. In addition, each common electrode 12 is formed over the above mentioned structures on the base substrate 1, and is shared by adjacent pixel units. The common electrode 12 is provided on a second passivation layer 13 and is insulated from the gate lines 2, the data lines 5 and the pixel electrode 11 on the base substrate 1.

Scanning signals are supplied to the gate electrode 3 of a pixel unit through one gate line 2 so that the pixel unit is selected. Data signals are supplied to the selected pixel unit through one data line 5 to generate the signals for controlling brightness and color of the selected pixel unit. Due to the structure of the common electrode 12, an overlapping region is formed between the common electrode and the at least one of the gate lines 2 and data lines 5 surrounding each pixel unit. Therefore, parasitic capacitance is generated in the overlapping region between the common electrode 12 and the overlapped scanning line (gate line 2 or data line 5), and thus delay of signal occurs over the overlapped gate line 2 or data line 5, which renders the display quality of the liquid crystal panel decreased.

According to this embodiment, a slit or opening 15 is provided in the common electrode 12 at the position where the common electrode 12 overlaps with the gate line 2 or data line 5 for each pixel unit. Such slit 15 is an example of an overlapping region slit. As shown in FIG. 2A, four slits or openings 15 are formed over the two gate lines and two date lines surrounding (or defining) each pixel unit, and the underlying gate lines 2 and the underlying date lines 5 are exposed through these slits or openings. Also, the slits 15 are independent from each other, and thus the common electrode 12 is of an integrated structure as a whole. By providing the slit 15, the overlapping region between the common electrode 12 and the overlapped scanning line (gate line 2 or data line 5) can be decreased, and thus parasitic capacitance is reduced.

The parasitic capacitance generated between the common electrode 12 and the overlapped gate line 2 or data line 5 can be expressed by the following formula:

$$C = \epsilon S/D \tag{1}$$

wherein $\epsilon$ is the dielectric constant of the dielectric materials provided between the common electrode 12 and the overlapped gate line 2 or data line 5, S is the area of the overlapping region between the common electrode 12 and the overlapped gate line 2 or data line 5, and D is the distance between the common electrode 12 and the overlapped gate line 2 or data line 5.

It can be obtained from the above formula that: when the dielectric constant $\epsilon$ and the distance D are kept constant, the parasitic capacitance C is decreased by decreasing the area of the overlapping region between the common electrode 12 and the overlapped gate line 2 or data line 5. In this way, the delay of signal over the overlapped gate line 2 or data line 5 can be decreased.

According to the embodiment, the slit is provided in the common electrode at the position where the common electrode overlaps with the one of the gate lines and the data lines surrounding (defining) a pixel unit, and thus the area of the overlapping region between the common electrode and the overlapped scanning line can be decreased. Therefore, the parasitic capacitance between the common electrode and the overlapped scanning line can be decreased and the delay of signal over the overlapped scanning line can be decreased.

The advantages of this embodiment will be further described by comparing this embodiment and the conventional technology. Compared with the conventional technology, the gate lines and the data lines in this embodiment are not necessarily formed of a low-resistivity material having low stability, and thus the stability of the array substrate can be improved. In addition, the widths and thicknesses of the gate lines and the data lines in this embodiment are not necessarily increased, and thus the increment of the overlapping region between the common electrode and the gate line and/or data line surrounding a pixel unit can be avoided, and the signal delay can be greatly decreased. In addition, in this embodiment, the signal delay can be decreased without increasing the amount of the driving circuits, and thus the manufacture cost of the array substrate can be decreased.

Figure 1A:
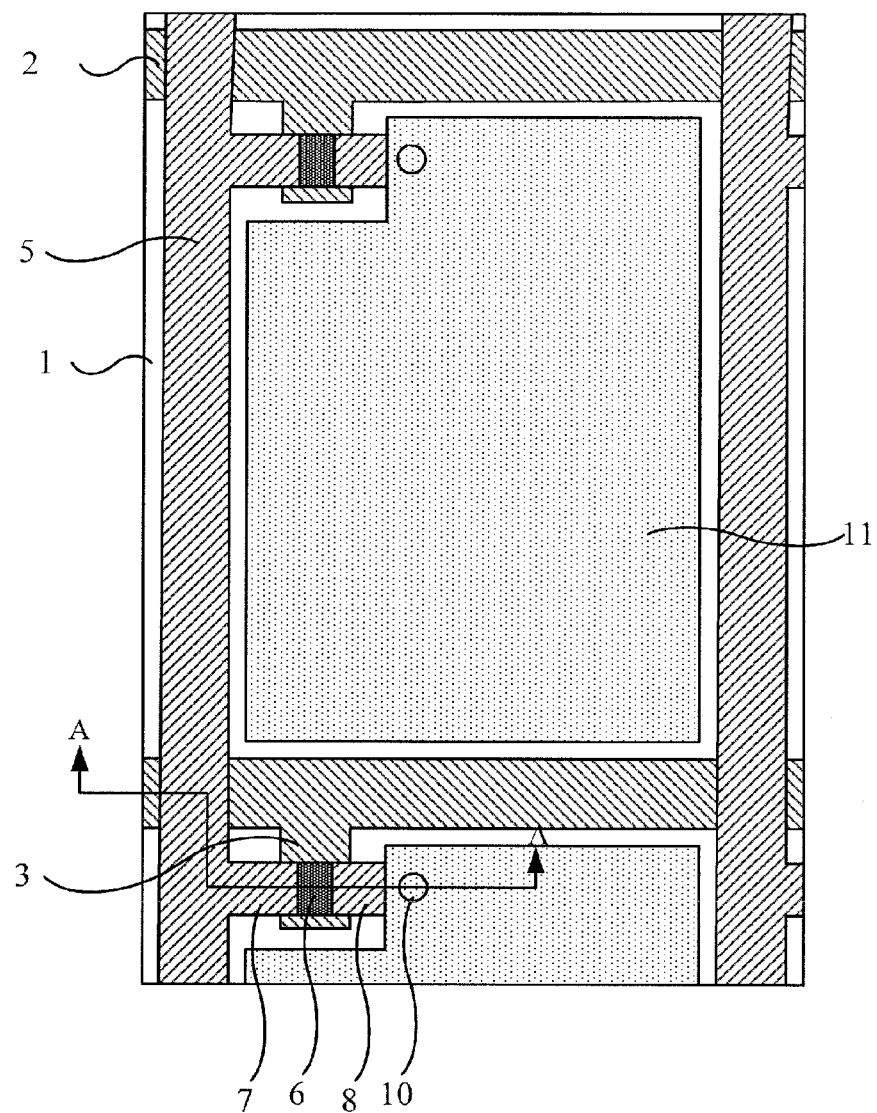
FIG. 1A is a top view showing a portion of a conventional array substrate.
Figure 1B:
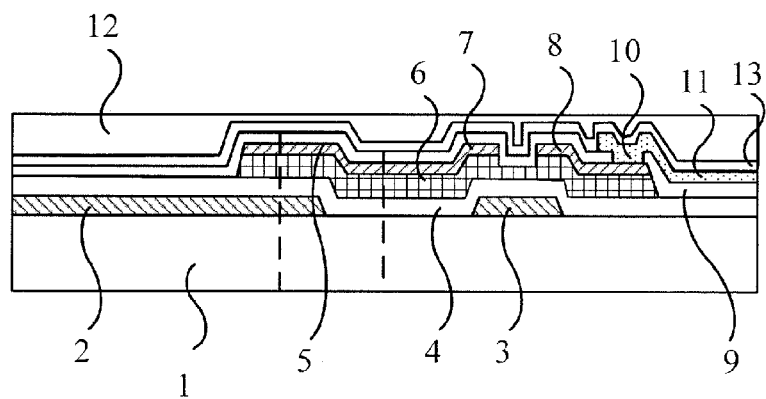
FIG. 1B is a sectional view taken along line A-A in FIG. 1.
Figure 1C:
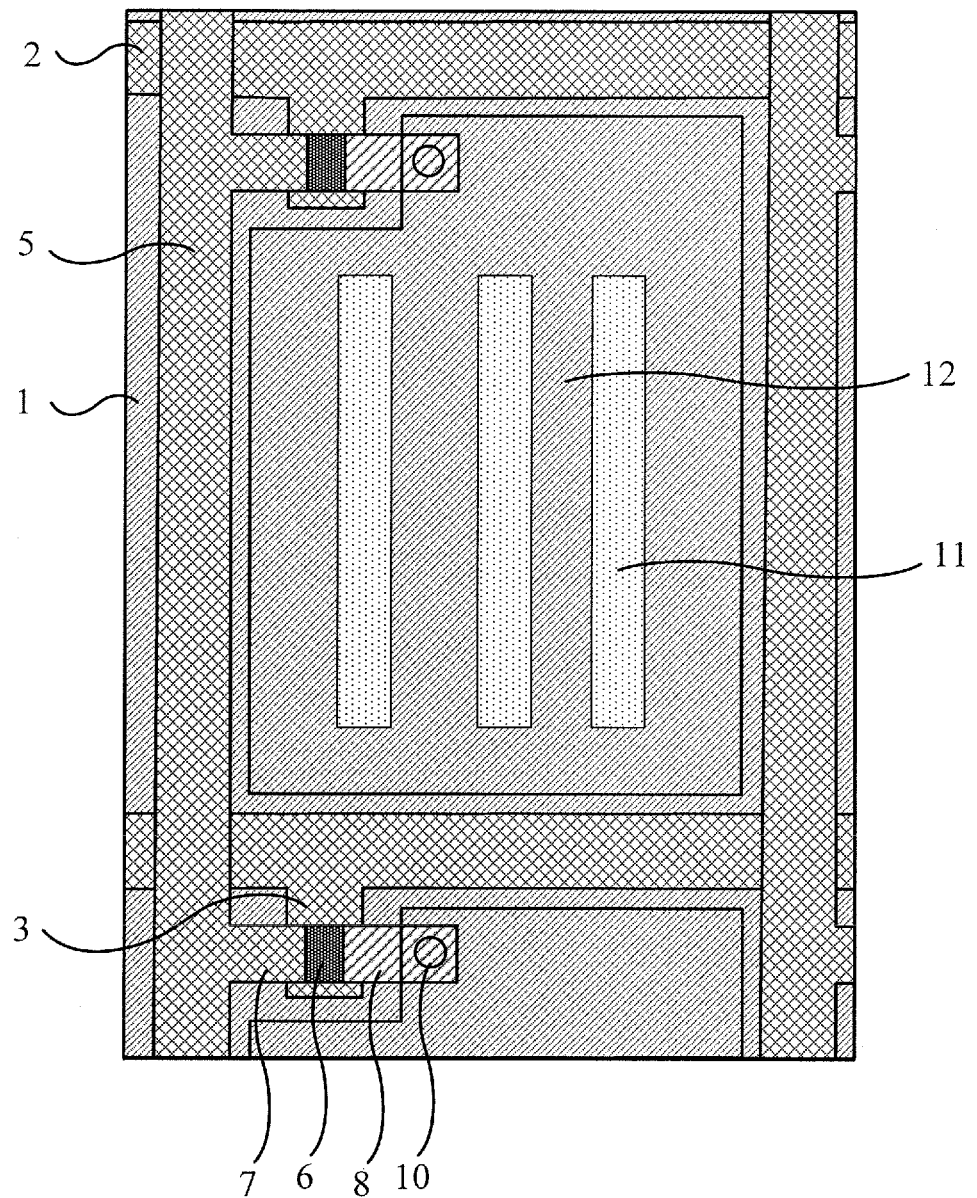
FIG. 1C is a top view showing a portion of a common electrode on the conventional array substrate.
Figure 1D:
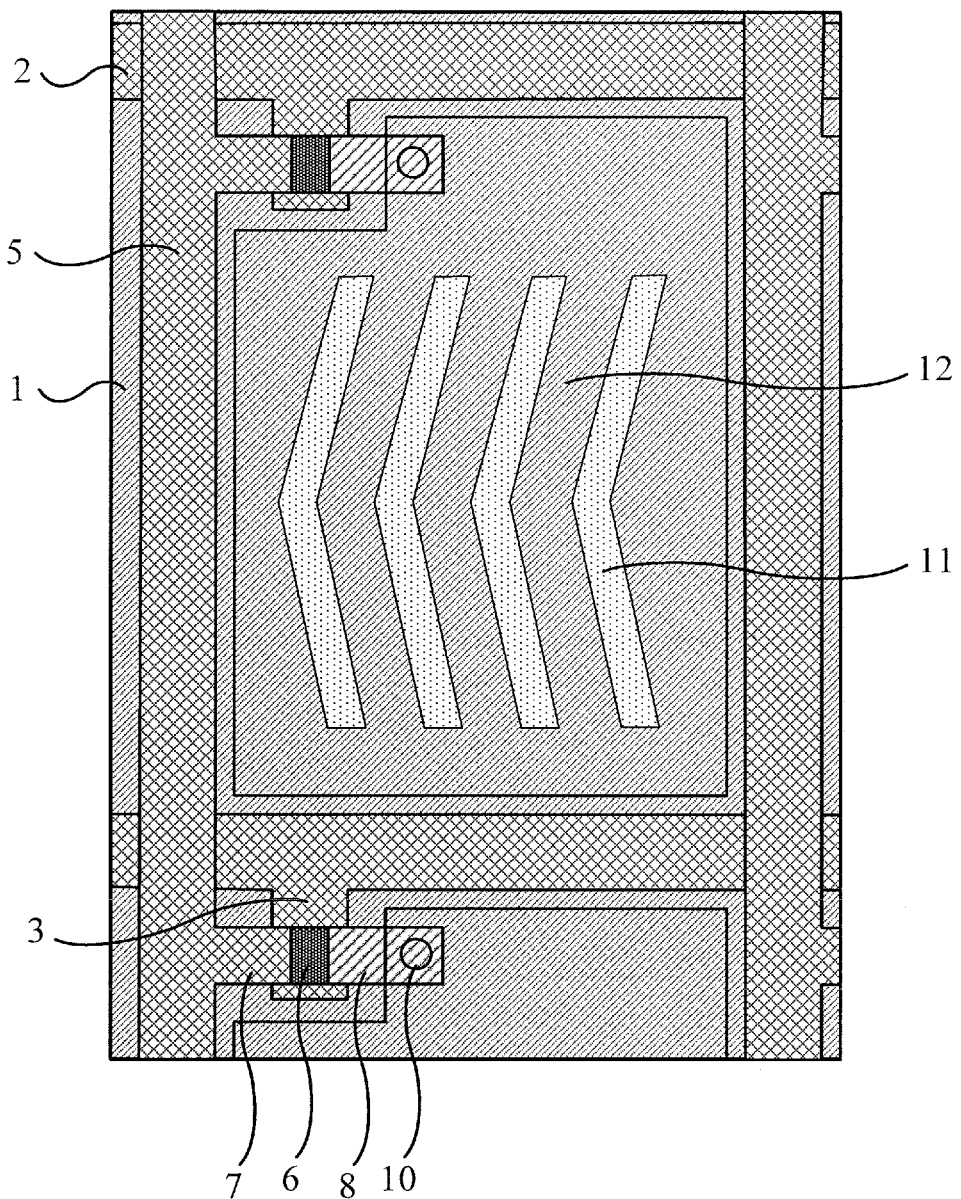
FIG. 1D is a top view showing a portion of another common electrode on the conventional array substrate.
Figure 1E:
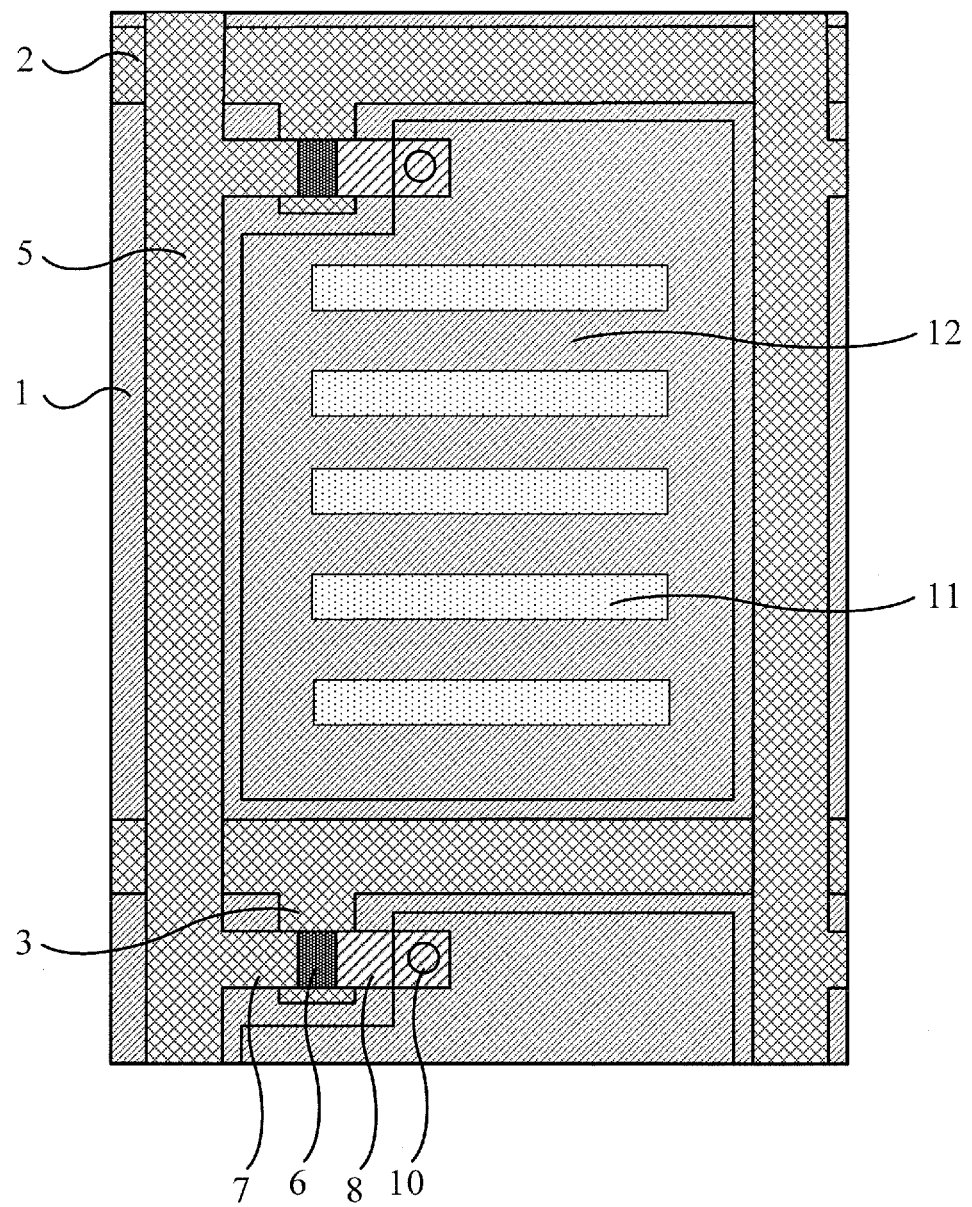
FIG. 1E is a top view showing a portion of still another common electrode on the conventional array substrate.
Figure 1F:
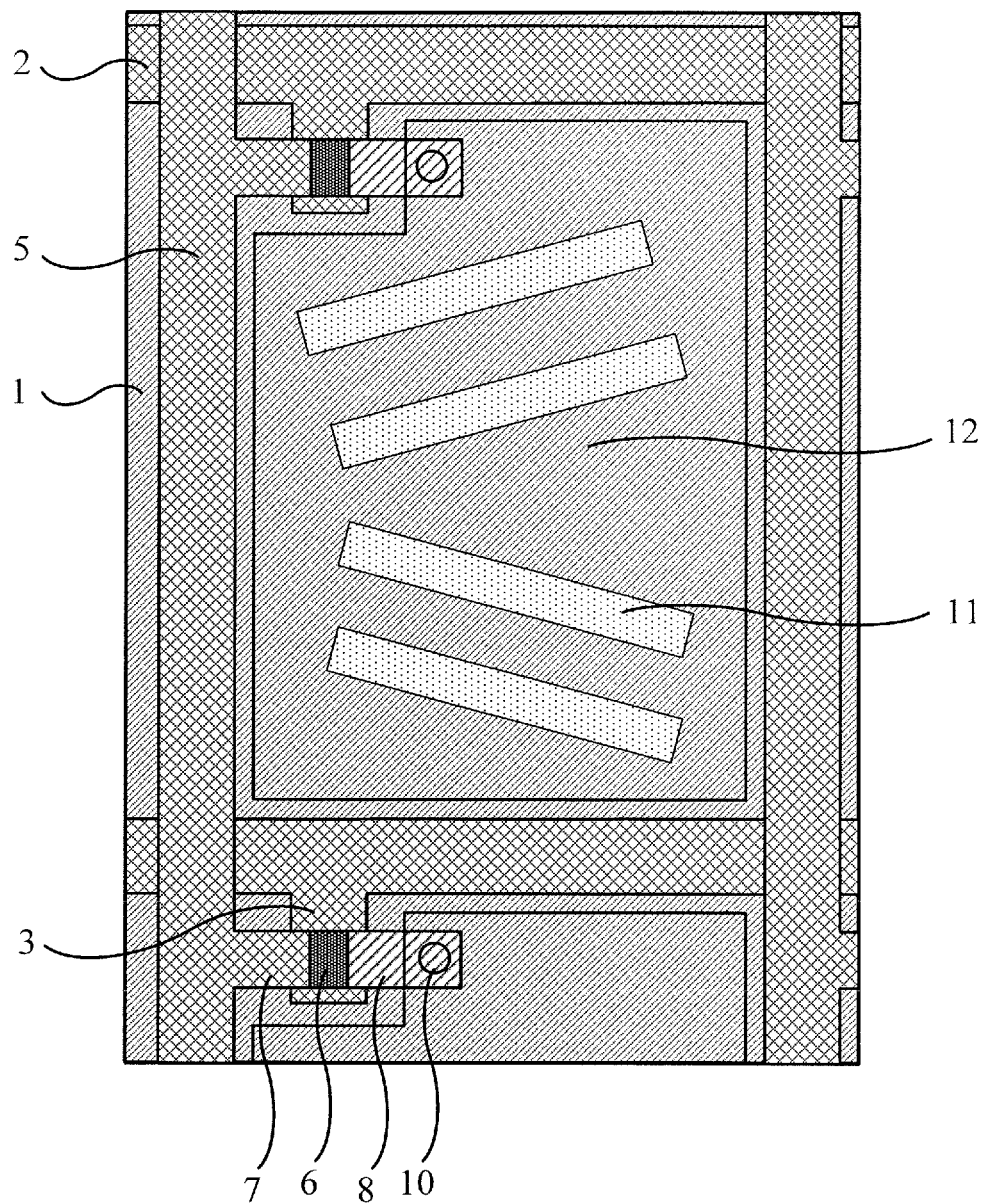
FIG. 1F is a top view showing a portion of still another common electrode on the conventional array substrate.

In addition, it should be noted that, the overlapping region between the common electrode 12 and the gate lines 2 and/or data lines 5 surrounding a pixel unit is in connection with the shape and position of the common electrode 12. If the common electrode 12 has the grid-like structure as shown in FIG. 1C, the common electrode 12 extends perpendicular to the gate lines 2 and parallel to the data lines 5, pixel unit slits 11 are formed in the common electrode 12 in the overlapping region between the common electrode 12 and the pixel electrode of the pixel unit, and in this case, the common electrode 12 and one of the gate lines 2 would have an overlapping region but the common electrode 12 and one of the data lines 5 may not have an overlapping region. For example, in the case that the width of the slits between the adjacent strips of the common electrode 12 is provided to be equal to or larger than the width of the data line 5 and the data line 5 is provided between the adjacent strips, there exists no overlapping region between the common electrode 2 and the data line 5. In addition, if the common electrode 12 has the grid-like structure as shown in FIG. 1E, the common electrode 12 extends parallel to the gate lines 2 and perpendicular to the data lines 5, and in this case, the common electrode 12 and one of the data lines 5 would have an overlapping region but the common electrode 12 and one of the gate lines 2 may not have an overlapping region. In addition, if the common electrode 12 has the grid-like structure as shown in FIG. 1D or 1F, the common electrode 12 and one of the gate lines 2 would have an overlapping region, and also the common electrode 12 and one of the data lines 5 would have another overlapping region.

According to this embodiment, the slit 15 is adapted to in any overlapping region. That is, the slit 15 may be provided in the common electrode 12 at the position where the common electrode 12 overlaps with the gate line 2 for one pixel unit, at the position where the common electrode 12 overlaps with the data line 5 for one pixel unit, or at both the positions where the common electrode 12 overlaps with the gate line 2 and the data line 5 for one pixel unit. The position for providing the slit 15 can be determined according to the specific structure of the array substrate. In this embodiment, as an example, the common electrode 12 has the grid-like structure shown in FIG. 1C, there exist an overlapping region between the common electrode 12 and each of the gate lines 2 and another overlapping region between the common electrode 12 and each of the data lines 5, and the slits 15 are provided in all of the overlapping regions.

Figure 3A:
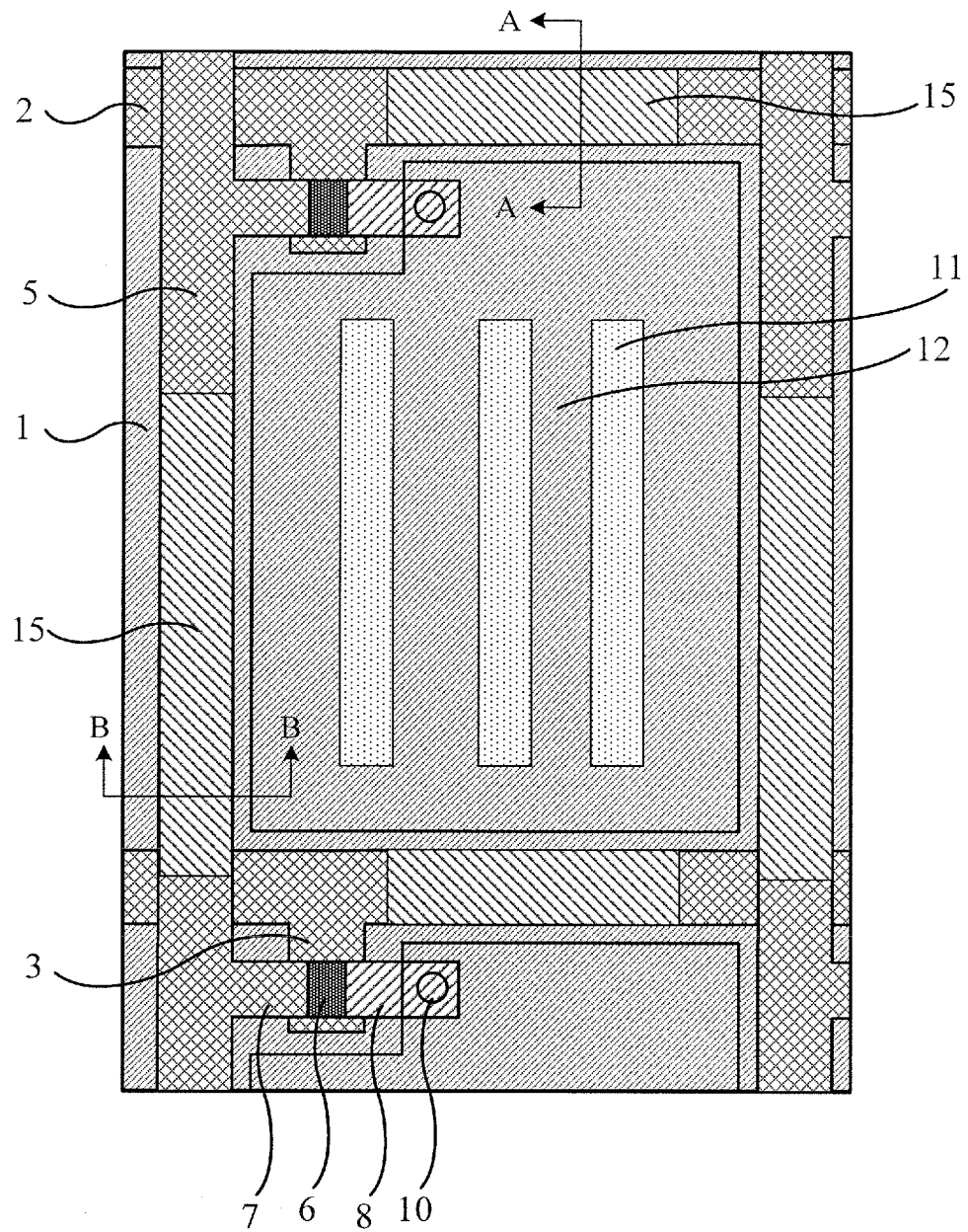
FIG. 3A is a top view showing a portion of another array substrate according to the first embodiment of the disclosed technology.
Figure 3B:
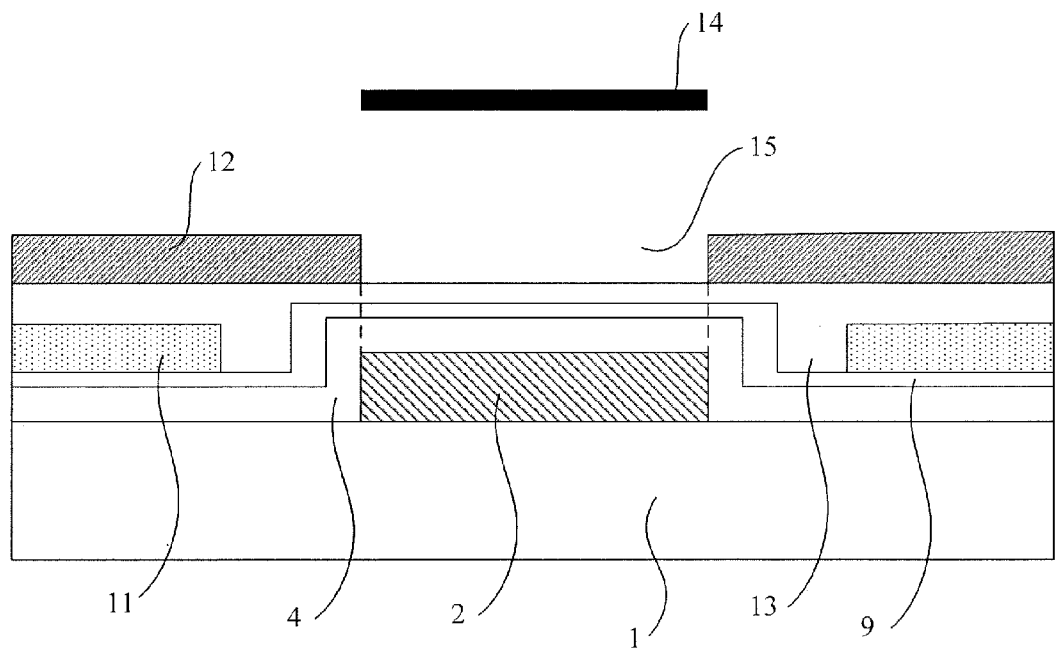
FIG. 3B is a sectional view taken along line A-A in FIG. 3A.
Figure 3C:
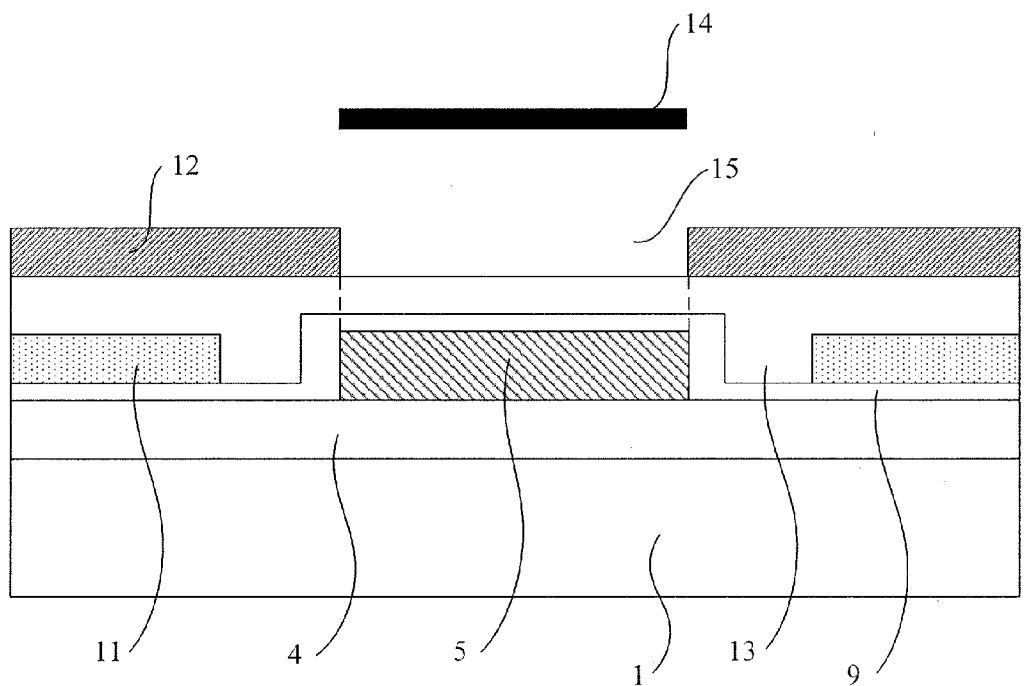
FIG. 3C is a sectional view taken along line B-B in FIG. 3A.
Figure 4A:
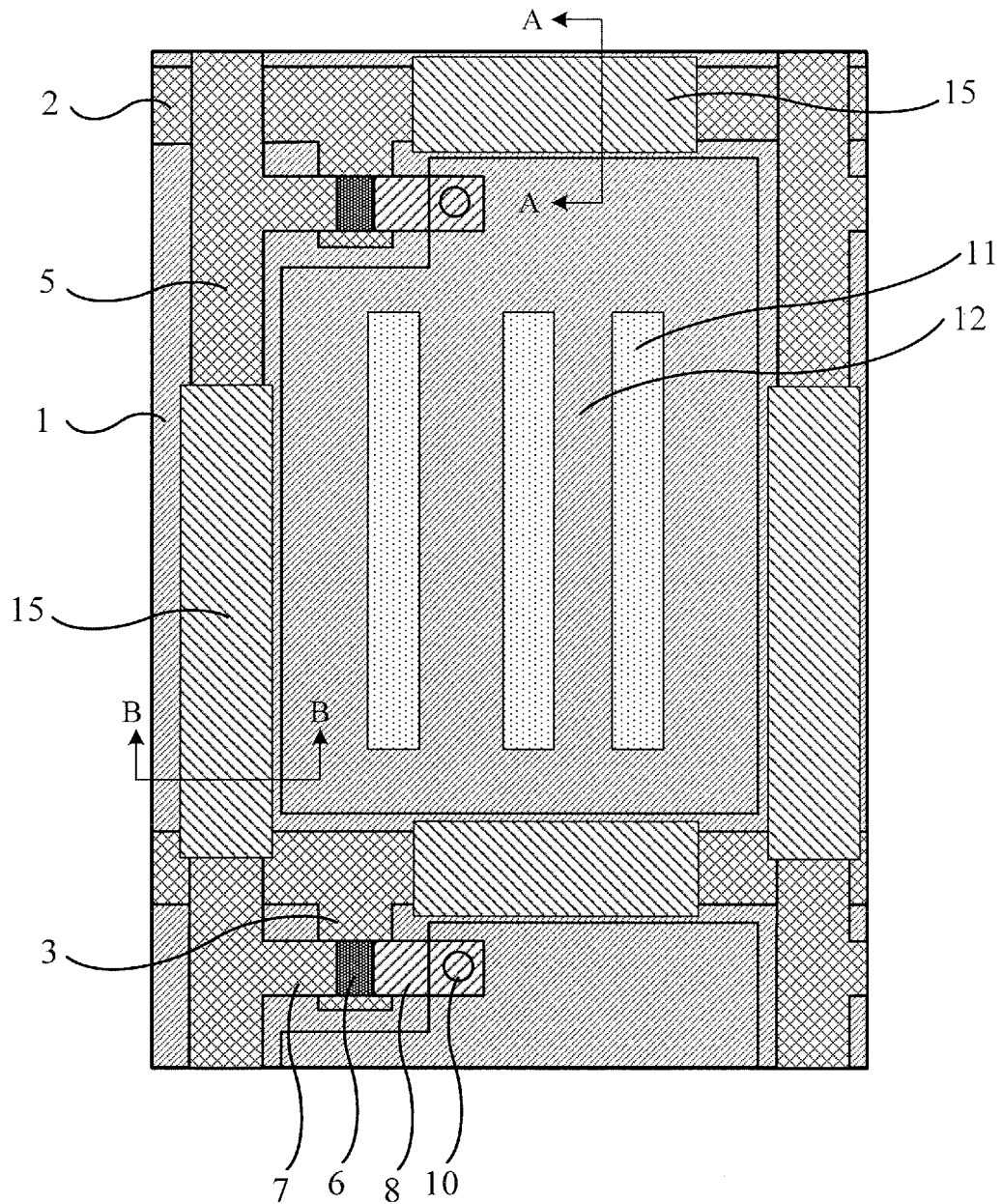
FIG. 4A is a top view showing a portion of still another array substrate according to the first embodiment of the disclosed technology.
Figure 4B:
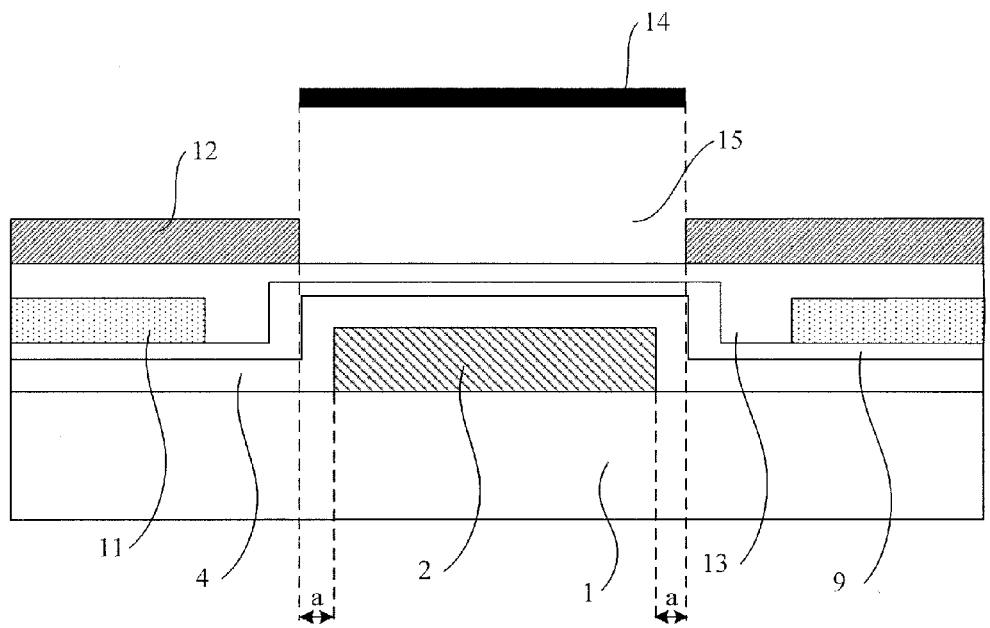
FIG. 4B is a sectional view taken along line A-A in FIG. 4A.
Figure 4C:
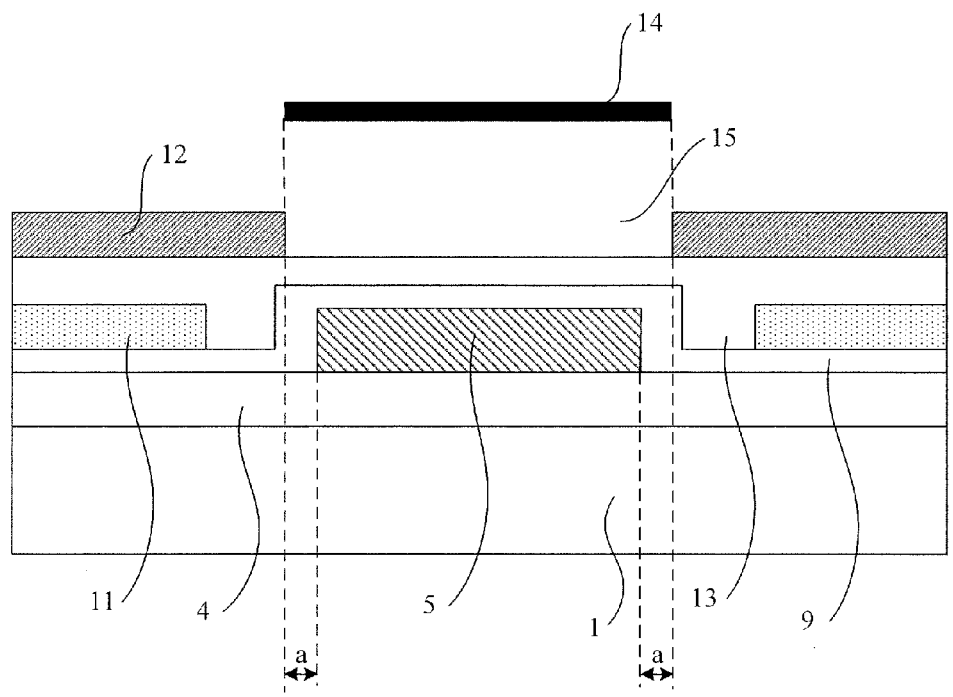
FIG. 4C is a sectional view taken along line B-B in FIG. 4A.

In addition, in this embodiment, there is no limit on the width of each slit in the overlapping region. The width of the slit 15 may be smaller than, equal to or larger than that of the overlapping region of the overlapped gate line 2 and/or data line 5. When the slit 15 is provided in the common electrode 12 at the position where the common electrode 12 overlaps with one gate line 2, the width of the slit 15 may be smaller than, equal to, or larger than that of the overlapping region of the gate line 2; however, it is preferable that the width of the slit 15 is equal to that of the gate line 2. When the slit 15 is provided in the common electrode 12 at the position where the common electrode 12 overlaps with one data line 5, the width of the slit 15 may be smaller than, equal to or larger than that of the overlapping region of the data line 5; however, it is preferable that the width of the slit 15 is equal to that of the data line 5. FIGS. 2A-2C show that the width of the slits 15 is smaller than that of the overlapped gate line 2 and that of the overlapping region of the overlapped data line 5, respectively. FIGS. 3A-3C show that the width of slits 15 is equal to that of the overlapped gate line 2 and that of the overlapped data line 5, respectively. FIGS. 4A-4C show that the width of the slits 15 is larger than that of the overlapping region of the overlapped gate line 2 and that of the overlapping region of the overlapped data line 5, respectively. It should be noted that, the width of the slit 15 provided in the overlapping region of the common electrode 12 and the overlapped gate line 2 and the width of the slit 15 provided in the overlapping region of the common electrode 12 and the overlapped data line 5 can be arbitrarily selected, but not limited to the cases shown in FIGS. 2A-4C. For example, the width of the slit provided in the overlapping region of the common electrode and the overlapped gate line may be smaller than that of the overlapping region of the overlapped gate line but the width of the slit provided in the overlapping region of the common electrode and the overlapped data line may be equal to or larger than that of the overlapping region of the overlapped data line. For example, the width of the slit provided in the overlapping region of the common electrode and the overlapped gate line may be equal to that of the overlapping region of the overlapped gate line but the width of the slit provided in the overlapping region of the common electrode and the overlapped data line may be smaller than or larger than that of the overlapping region of the overlapped data line. For example, the width of the slit provided in the overlapping region of the common electrode and the overlapped gate line may be larger than that of the overlapping region of the overlapped gate line but the width of the slit provided in the overlapping region of the common electrode and the overlapped data line may be equal to or smaller than that of the overlapping region of the overlapped data line.

In addition, there may be more than one slit in one overlapping region of the common electrode of a pixel unit, for example, two or three slits. These slits can be arranged in order along the overlapped scanning line, or parallel to each other and parallel to the overlapped scanning line.

In the structure of the array substrate as shown in FIGS. 2A-2C, the portions of the common electrode 12 at the positions where the common electrode 12 respectively overlaps with the gate lines 2 and the data lines 5 are partially removed to form the slits 15 around the pixel unit, and thus the area of the overlapping regions between the common electrode and the gate lines and data lines is decreased. In this way, the parasitic capacitance is decreased and the signal delay over the gate lines and the data lines is decreased accordingly. The array substrate with such structure can be easily realized, and at the same time, other structures or manufacture processes of the liquid crystal display are not necessarily changed. For example, the arrangement of the black matrix on the color filter substrate can be unchanged.

The structure as shown in FIGS. 3A-3C is a modification of that as shown in FIG. 2A-2C, in which the portions of the common electrode 12 at the positions where the common electrode respectively overlaps with the gate lines 2 and the data lines 5 are entirely removed by providing the slits 15. In this case, the signal delay over the gate lines and the data lines can be decreased to the largest extent without changing the length and width of the black matrix provided on the color filter substrate facing the array substrate. Therefore, the structure as shown in FIG. 3A-3C is a preferable structure.

The structure as shown in FIG. 4A-4C is a modification of that as shown in FIGS. 3A-3C, in which the portions of the common electrode 12 at the positions where the common electrode respectively overlaps with the gate lines 2 and the data lines 5 are entirely removed and the edges of the common electrode 12 over the gate line/data line side are away from the gate lines/data lines with a distance a by providing the slits 15. In this case, the parasitic capacitance is further decreased and the signal delay over the gate lines/data lines is further decreased as well. In addition, due to the distance "a," and the length of the black matrix provided on the color filter substrate is increased to prevent light leakage from occurring in this structure.

According to this embodiment, by partially or entirely removing the portion of the common electrode 12 in the overlapping region where the common electrode 12 overlaps with one of the gate lines or the data lines, the signal delay over the overlapped scanning line can be decreased. Thus, the display quality of the liquid crystal display can be improved, and it is favorable for the liquid crystal panel of a larger size and a higher resolution.

In addition, in this embodiment, there is no limit on the shape of the slit 15. For example, the slit 15 may be rectangular, circular, polygonal and the like in shape. In addition, in FIGS. 3A-3C, the portion of the common electrode in the overlapping region where the common electrode overlaps with one of the gate lines and the data lines is just entirely removed while other components of the liquid crystal display is kept unchanged. Therefore, the structure s shown in FIGS. 3A-3C is the most preferable structure. Similarly, the shape of the slit may be determined according to the shape of the overlapping region between the common electrode and the overlapped scanning line, and it is most preferable that the shape of the slit is exactly coincided with that of the corresponding overlapping region.

In addition, the array substrate according to this embodiment may be manufactured by the following steps.

Step 501, depositing a gate metal film on a base substrate;

Step 502, etching the gate metal film by a patterning process with a single-tone mask to form gate lines and gate electrodes connected with the gate lines or integrated with the gate lines;

Step 503, forming a gate insulating layer, an active layer film and a data line metal film in order on the base substrate having the above patterns formed in Step 502;

Step 504, etching the data line metal film and the active layer film by a patterning process with a dual-tone mask to form data lines and source electrodes, drain electrodes and active layers of thin film transistors;

Step 505, forming a first passivation layer on the base substrate having the above patterns formed in Step 504;

Step 506, etching the first passivation layer by a patterning process with a single-tone mask to form a passivation layer via hole on each drain electrode;

Step 507, depositing a transparent conductive film on the base substrate having the patterns formed in Step 506;

Step 508, etching the transparent conductive film by a patterning process with a single-tone mask to form the pixel electrode in each pixel unit;

Step 509, forming a second passivation layer on the base substrate having the above patterns formed in Step 508; and Step 510, forming a common electrode of a grid-like shape which has the slit(s) in each pixel unit on the patterns formed in Step 509.

Further, in an example, the Step 510 may be implemented as follows. Firstly, a common electrode layer is deposited; next, removing the portion of the common electrode layer in the light-completely-transmitting regions by a patterning process with a half-tone or gray-tone mask to form the common electrode of a grid-like shape; and finally, partially or entirely removing the portions of the common electrode at the positions where the common electrode overlaps with the gate lines and/or data lines to form the slits in the common electrode.

The above-described steps may be implemented by using those in the manufacture process for the conventional array substrate, and thus the details thereof are omitted here for simplicity. In addition, it should be noted that, the above-described steps are an example of the process for manufacturing the array substrate according to the embodiment, and the patterns formed on the base substrate prior to the Step 509 may be formed by other different steps. In addition, in the Step 510, the grid-like structure in pixel units and the slits of the common electrode may be simultaneously formed by a same patterning process.

In the Step 510, when the portion of the common electrode in each overlapping region is partially removed, the array substrate shown in FIG. 2A-2C can be formed; when the portion of the common electrode in the overlapping region is entirely removed, the array substrate shown in FIGS. 2A-3C or FIGS. 4A-4C can be formed.

In the array substrate manufactured by the above-described steps, the area of each overlapping region between the common electrode and one of the gate lines and/or data lines is decreased by providing a slit (or slits) in such overlapping region, and thus the parasitic capacitance can be decreased. Therefore, the signal delay over the gate line and/or data line can be decreased, the display quality of the liquid crystal display can be improved and the liquid crystal panel can be of a larger size and a higher resolution.

Second Embodiment

According to a second embodiment of the disclosed technology, a liquid crystal panel is provided. The liquid crystal panel comprises an array substrate, a color filter substrate and a liquid crystal layer sandwiched between the two substrates. The array substrate of the liquid crystal panel employs the array substrate according to the first embodiment in which a slit is provided for one pixel unit in the common electrode at the position where the common electrode overlaps with one of the gate lines and/or data lines. In addition, a black matrix is provided on the color filter substrate of the liquid crystal panel to block or shield the components such as the data lines, the gate lines and the like on the array substrate and prevent light leakage. When the width of the slit of the common electrode is smaller than or equal to that of the overlapped gate line or data line, the light passing through the slit is blocked by the black matrix on the color filter substrate without changing the length and width of the black matrix. If the width of the slit of the common electrode is larger than that of the overlapped gate line or data line, the length and width of the black matrix should be increased to be larger than or equal to the width of the silt so that the light passing through the slit can be blocked. In this embodiment, the slits of the common electrode may employ the structures as shown in FIGS. 2A-4C. If the structure as shown in FIGS. 2B and 2C or FIGS. 3B and 3C are employed, the length and width of the black matrix on the corresponding color filter substrate is kept unchanged. If the structure shown in FIGS. 4B and 4C is employed, the length and width of the black matrix on the corresponding color filter substrate is increased to be equal to the width of the slit. The length and width of the black matrix may equal to the width of the gate line and/or data line, as shown in FIGS. 2B and 2C or FIGS. 3B and 3C. However, the length of the black matrix can be a little larger than the width of the gate line and/or data line so that the light leakage is completely prevented.

In the liquid crystal panel according to this embodiment, the length and width of the black matrix on the color filter substrate may be increased so as to cooperate with structures on the array substrate. In addition, in the liquid crystal panel according to this embodiment, since the length and width of the black matrix on the color filter substrate can be adjusted according to the width of the slits provided in the overlapping regions between the common electrode and the gate lines/data lines, the width of the slits is not specifically limited, and thus the area of the overlapping regions between the common electrode and the gate lines/data lines can be decreased enough depending on the practical requirements. Therefore, the parasitic capacitance between the common electrode and the gate lines/data lines can be decreased, the signal delay over the gate lines/data lines can be decreased, and accordingly the display quality of the liquid crystal panel can be improved.

Third Embodiment

According to the third embodiment of the disclosed technology, a liquid crystal display is provided. The liquid crystal display comprises an external house or frame, a liquid crystal panel, a driving circuit and a backlight module.

The liquid crystal panel comprises an array substrate, a color filter substrate and a liquid crystal layer sandwiched between the substrates. The driving circuit and the backlight module are assembled together with the liquid crystal panel, and the resultant assembly is packaged and held by the external house so that the liquid crystal display can be provided.

In this embodiment, the array substrate of the liquid crystal display employs the array substrate according to the first embodiment of the disclosed technology. Thus, by providing slits in common electrode in overlapping regions between the common electrode and the gate lines/data lines, the area of each the overlapping region can be decreased. Therefore, the parasitic capacitance between the common electrode and the gate lines/data lines can be decreased, the signal delay over the gate lines/data lines can be decreased, and accordingly the display quality of the liquid crystal display can be improved.

It should be appreciated that the embodiments described above are intended to illustrate but not limit the disclosed technology. Although the disclosed technology has been described in detail herein with reference to the preferred embodiments, it should be understood by those skilled in the art that the disclosed technology can be modified and some of the technical features can be equivalently substituted without departing from the spirit and scope of the disclosed technology.

What is claimed is:

1. An array substrate comprising:
a base substrate, and
a plurality of gate lines, a plurality of data lines, and a common electrode formed on the base substrate,
wherein a plurality of pixel units are defined by the intersecting of the gate lines and the data lines, a pixel electrode is provided in each of the pixel units, the common electrode extends over the pixel units and overlaps the pixel units, also the common electrode overlaps with the gate lines and the data lines, and an overlapping region slit is provided in the common electrode for each pixel unit in an overlapping region between the common electrode and one of the gate lines and data lines surrounding the pixel unit, and
wherein more than one overlapping region slits are provided in the overlapping region on one side of the pixel unit, and these overlapping region slits are parallel to each other and parallel to the corresponding gate line or data line.

2. The array substrate according to claim 1, wherein the width of the overlapping region slit is smaller than that of the overlapped gate line or data line.

3. The array substrate according to claim 1, wherein the width of the overlapping region slit is equal to that of the overlapped gate line or data line.

4. The array substrate according to claim 1, wherein the width of the overlapping region slit is larger than that of the overlapped gate line or data line.

5. The array substrate according to claim 1, wherein the common electrode is provided over and overlaps with the pixel electrode of each pixel unit, and pixel unit slits are provided in the common electrode in the overlapping region between the common electrode and the pixel electrode of the pixel unit.

6. The array substrate according to claim 5, wherein the pixel unit slits comprises a plurality of strip-like slits.

7. The array substrate according to claim 1, wherein the common electrode is formed of a transparent conductive material.

8. The array substrate according to claim 1, wherein overlapping regions slits are provided in each of the overlapping regions between the common electrode and gate lines and data lines surrounding each pixel unit.

9. The array substrate according to claim 8, wherein the overlapping region slits for each pixel unit are independent to each other.

10. A liquid crystal panel, comprising:
an array substrate,
a color filter substrate, and
a liquid crystal layer sandwiched between the array substrate and the color filter substrate,
wherein the array substrate comprises a base substrate, and a plurality of gate lines, a plurality of data lines, and a common electrode formed on the base substrate,
wherein a plurality of pixel units are defined by the intersecting of the gate lines and the data lines, a pixel electrode is provided in each of the pixel units, the common electrode extends over the pixel units and overlaps the pixel units, and also the common electrode overlaps with the gate lines and the data lines, and an overlapping region slit is provided in the common electrode for each pixel unit in an overlapping region between the common electrode and one of the gate lines and data lines surrounding the pixel unit, and
wherein more than one overlapping region slits are provided in the overlapping region on one side of the pixel unit, and these overlapping region slits are parallel to each other and parallel to the corresponding gate line or data line.

11. The liquid crystal panel according to claim 10, wherein a black matrix is provided on the color filter substrate and the length of the black matrix is provided to be able to block the light passing through the slit.

12. A liquid crystal display comprising:
an external house,
a liquid crystal panel comprising an array substrate,
a driving circuit, and
a backlight module,
wherein the array substrate comprises a base substrate, and a plurality of gate lines, a plurality of data lines, and a common electrode formed on the base substrate,
wherein a plurality of pixel units are defined by the intersecting of the gate lines and the data lines, a pixel electrode is provided in each of the pixel units, the common electrode extends over the pixel units and overlaps the pixel units, and also the common electrode overlaps with the gate lines and the data lines, and an overlapping region slit is provided in the common electrode for each pixel unit in an overlapping region between the common electrode and one of the gate lines and data lines surrounding the pixel unit, and
wherein more than one overlapping region slits are provided in the overlapping region on one side of the pixel unit, and these overlapping region slits are parallel to each other and parallel to the corresponding gate line or data line.

* * * * *